United States Patent [19]

Tutihasi

[11] 3,958,207

[45] May 18, 1976

[54] INJECTION CURRENT DEVICE AND METHOD

[75] Inventor: Simpei Tutihasi, Pittsford, N.Y.

[73] Assignee: Xerox Corporation, Stamford, Conn.

[22] Filed: July 17, 1974

[21] Appl. No.: 489,285

[52] U.S. Cl. ............................ 338/15; 23/230 LC; 250/213 A; 350/160 LC
[51] Int. Cl.² ............................................ H01C 7/08
[58] Field of Search .............. 96/1.5, 1 R; 117/17.5; 338/15; 250/213; 23/230 LC; 350/160 LC

[56] References Cited
UNITED STATES PATENTS

| | | |
|---|---|---|
| 2,792,447 | 5/1957 | Kazan .................................. 338/15 |
| 2,930,999 | 3/1960 | Van Santen et al. ................. 338/15 |
| 3,732,429 | 5/1973 | Braunstein et al. ............. 250/213 R |
| 3,838,059 | 9/1974 | Wong ............................. 23/230 LC |

*Primary Examiner*—C. L. Albritton
*Attorney, Agent, or Firm*—James J. Ralabate; Michael H. Shanahan; George J. Cannon

[57] ABSTRACT

High quantum yields are provided by sandwiching an insulating layer in contact with a photoconductor between two electrodes. The sandwiched structure in conjunction with an applied electrical potential and excitation light provides an electrical switching device. Optionally, an imaging layer can be included between the photoconductive layer and one of the electrodes, and can be imaged with increased sensitivity.

13 Claims, 3 Drawing Figures

INJECTION CURRENT DEVICE AND METHOD

BACKGROUND OF THE INVENTION

This invention relates to field-induced injection currents across insulating layers, and more particularly, high quantum yields thereof when said insulating layer is in contact with a photoconductive layer and the photoconductor is struck by suitable light.

Light is physically viewed as possessing the characteristics of wave motion and energy particles. The characteristic of an energy particle is generally attributed to the photon quantum of light. Generally speaking, when a photon quantum of light strikes a photoconductive material, one pair of charge carriers constituting a negative charge and a positive charge is created. Typically, one of the charge carriers of the pair of charge carriers moves in photoconductive material struck by the photon quantum of light while the other remains substantially in the location of creation. The negative charge carrier is generally referred to as an electron while the positive charge carrier is generally referred to as a hole. It has been found that when light strikes a photoconductive material, one photon quantum of light is required to generate one pair of charge carriers. Thus, the maximum quantum efficiency, expressed as number of pair of charge carriers created per photon quantum of light, has a maximum value of 1. Typically, the quantum efficiency is less than 1.

In order to obtain photoconductive gain greater than unity, it has been generally felt necessary that Ohmic contact, e.g., a reservoir of charge at the metal-photoconductor interface, be present. It was further generally felt that with a blocking contact to the photoconductor, e.g., a non-ohmic contact with a Schottky energy barrier at the metal-photoconductor interface, photoconductive gains greater than unity could not be achieved. See, for example, "Photoconductive Gain Greater than Unity in CdSe Films with Schottky Barriers at the Contacts", R. R. Mehta and B. S. Sharma, *J. Appl. Phys.*, Vol. 44, No. 1, January, 1973. According to this article, the authors were able to achieve a photoconductive gain greater than unity with gold electrodes in contact with the photoconductor wherein the gold contacts were determined to be non-ohmic with a Schottky energy barrier between the electrode and the photoconductor and wherein the radiation utilized was bandgap radiation of the photoconductor. No insulating layer was deliberately inserted between the gold electrode and photoconductor.

Conduction through a physical, electrically insulating barrier is reported in "Thermally Assisted Tunneling in Dielectric Films", G. G. Roberts and J. I. Polanco, *Phys. Stat. Sol. (a)*, 1, 409 (1970). In the latter article, the authors reported findings in the characteristic relationship between current flow in, and voltage applied to, an insulating organic layer sandwiched between two electrodes. No photoconductive layer is utilized and no mention is made of gain photocurrent.

Conduction through a semi-conductor layer adjacent a few-atoms-thin layers of insulating materials is theoretically presented in "The Physical Review B", F. Schmidlin, 1, 4, pages 1583–1587 (1970).

U.S. Pat. No. 3,732,429 discloses the use of an inorganic insulating layer in contact with a photoconductor in order to obtain a higher dark impedance in conjunction with a liquid crystalline layer. All three layers are sandwiched between a pair of electrodes.

In new and growing areas of technology, new methods, apparatus, compositions, and articles of manufacture are often discovered for the application of the new technology in a new mode. The present invention relates to a new and advantageous system for providing gain photocurrent.

SUMMARY OF THE INVENTION

It is, therefore, an object of the invention to provide a novel system for providing gain photocurrent.

It is another object of this invention to provide a novel method for producing gain photocurrent.

It is yet a further object of this invention to provide a novel gain photocurrent device.

It is still yet a further object of this invention to provide a novel electrical switching device.

It is still a further object of this invention to provide a gain photocurrent system which can be utilized with various imaging layers to enhance the imaging of said layers.

The foregoing objects and others are accomplished in accordance with this invention by deliberately providing an insulating layer in contact with a photoconductive layer. The ratio of photoconductive layer thickness to insulating layer thickness being at least about 10 to 1, sandwiching both between electrodes, applying an electrical field and impinging the photoconductive layer with activating light. Gain photocurrent or secondary current is thereby provided which is many times greater than the primary current.

BRIEF DESCRIPTION OF THE DRAWINGS

For a better understanding of the invention as well as other objects and further features thereof, reference is made to the following detailed disclosure of the preferred embodiments of the invention taken in conjunction with the accompanying drawings thereof, wherein.

DESCRIPTION OF THE PREFERRED EMBODIMENTS

Figure 1:
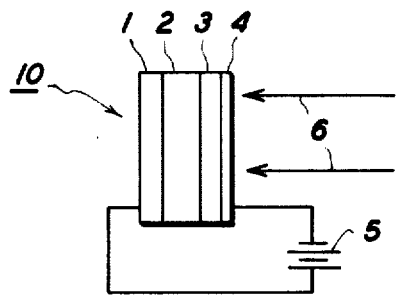
FIG. 1 is a schematic illustration of a typical device which provides gain photocurrent in accordance with the invention.

Referring now to FIG. 1, the gain photocurrent device or electrical switching device of the present invention is generally represented as 10. The device comprises electrodes 1 and 4, insulating layer 2 and photoconductive layer 3, layer 3 being at least about ten times as thick as layer 2.

Electrodes 1 and 4 may comprise any suitable material which allows the provisioning from voltage source 5 of a potential across insulating layer 2 and photoconductive layer 3. Typical suitable materials include metals such as platinum, silver, tin, aluminum, gold, copper, indium, gallium; conductive metal oxides such as, for example, tin oxide, indium oxide; insulating substrates coated with conductive layers such as NESA glass comprising a thin coating of tin oxide over glass and commercially available from Pittsburgh Plate and Glass Company. Any suitable electrode material can be utilized. However, in particularly preferred embodiments of the invention when characteristics of the photoconductive layer, electrodes and insulating layer are preferably matched in order to provide even a greater gain in photocurrent, the work function is selectively chosen to match the characteristics of the photoconductive layer and the insulating layer. "Work function" or derivations thereof is used herein in the conventional sense well known to those skilled in the art; and "high work function" is used herein to designate materials which have a work function at or above 4.5 eV while "low work function" is used herein to refer to materials which have a work function below about 4.5 eV.

Surprisingly, it has been found in accordance with this invention that an insulating layer, even a relatively thick insulating layer, in contact with the photoconductor provides a gain photocurrent many times that of the primary photocurrent. This is indeed unexpected in view of the fact that prior to the present invention it was felt by those skilled in the art that only Ohmic contact could provide photoconductive gain greater than unity and that an insulating or blocking contact would provide a photoconductive gain no greater than unity.

Any suitable insulating layer can be utilized in the present invention. Such layers may include insulating inorganic materials such as, for example, metallic oxides which are nonconductive and may include insulating organic materials. Any suitable insulating organic material may be used. Typical insulating organic materials include: poly(2-propene-anthracene), poly(2-vinyl-anthracene), poly[1-(2-anthryl)ethylmethacrylate], phenoxy resin — a high molecular weight thermoplastic copolymer of bisphenol A and epichlorohydrin having the basic molecular structure — $[OC_6H_4C(CH_3)_2C_6H_4OCH_2CH(OH)CH_2]_n$ where $n$ is equal to about 100 (the foregoing material being representative of insulating materials having a low ionization potential of below about 8 eV) polystyrene, polyvinylcarbazole, polyethylene, polycarbonate resins such as, for example, LEXAN — a thermoplastic carbonate linked polymer produced by reacting bisphenol A with phosgene, available from General Electric Company, the various parylenes such as poly-para-xylylene and poly-monochloro-paraxylyleene, a 65/35 weight percent copolymer of styrene and n-butylmethacrylate, a 70/30 weight percent copolymer of styrene and hexylmethacrylate (the foregoing being representative of insulating materials having "high" electron affinity above about 1.5 eV).

It will be understood, of course, that any suitable insulating layer may be used regardless of the value of its ionization potential. However, for particularly preferred embodiments mentioned above and which will be described below, the ionization characteristics of the material utilized in the insulating layer 2 is appropriately matched with the characteristics of the photoconductive layer and the work function of the electrodes. Other typical suitable insulating material for insulating layer 2 include: classes of materials such as polystyrenes, alkyd substituted polystyrenes, polyolefins, styrene acrylic copolymers, styrene-olefin copolymers, silicone resins, phenolic resins, and organic amorphous glasses. Typical suitable materials include Staybelite Ester 10, a partially hydrogenated rosin ester, Foral Ester, a hydrogenated rosin triester, and Neolyn 23, an alkyd resin, all from Hercules Powder Co., SR 82, SR 84, silicone resins, both obtained from General Electric Corporation; Velsicol X-37, a polystyrene-olefin copolymer from Velsicol Chemical Corp.; hydrogenated Piccopale 100, a highly branched polyolefin, HP-100, hydrogenated Piccopale 100, Piccotex 100, a copolymer of methyl styrene and vinyl toluene, Piccolastic A-75, 100 and 125, all polystyrenes, Piccodiene 2215, a polystyrene-olefin copolymer, all from Pennsylvania Industrial Chemical Co., Araldite 6060 and 6071, epoxy resins of Ciba; Amoco 18, a poly alpha-methylstyrene from Amoco Chemical Corp.; ET-693, and Amberol ST, phenol-formaldehyde resins, ethyl cellulose, and Dow C4, a methylphenylsilicone, all from Dow Chemical; R5061A, a phenylmethyl silicone resin, from Dow Corning; Epon 1001, a bisphenol epichlorohydrin epoxy resin, from Shell Chemical Corp.; and PS-2, PS-3, both polystyrenes, and ET-693, a phenol-formaldehyde resin, from Dow Chemical; and Nirez 1085 a polyterpene resin, available from Tenneco Corporation under that tradename.

Photoconductive layer 3 may comprise any suitable photoconductive material. Typical suitable photoconductive materials include photoconductive inorganic materials and photoconductive organic materials. Typical suitable inorganic photoconductive materials include sensitized zinc oxide, for example, sensitized by the addition of Rodamine Dye, available from Dupont, selenium, selenium alloyed with arsenic such as, for example, arsenic triselenide, tellurium, antimony or bismuth; cadmium sulfide, cadmium sulfoselenide, and the many other typical suitable inorganic photoconductive materials listed in U.S. Pat. No. 3,121,006 to Middleton et al. and listed in U.S. Pat. No. 3,288,603, both of which patents are hereby incorporated by reference. Typical suitable organic photoconductive materials include, for example, the combination of 2,5-bis(p-aminophenyl)-1,3,4-oxadiazole available under the trademark TO 1920 from Kalle and Company, Weisbaden-Biebrich, Germany and Vinylite VYNS, a copolymer of vinyl chloride and vinyl acetate, available from Carbide and Carbon Chemicals Companyl; and the combination of 2,4,7-trinitro-9-fluorenone to polyvinylcarbazole, available under the trademark Luvican 170 from Winter, Wolf and Company, New York, New York. The thickness of the photoconductive layer 3 is not critical to the practice of the invention and any thickness which provides gained photocurrent may be utilized.

As previously stated, any combination of material for electrodes 1 and 4, insulating layer 2 and photoconductive layer 3 may be utilized to obtain gain photocurrent in accordance with the present invention. However, enhanced results are obtained in particularly preferred embodiments when the characteristics of the electrodes, insulating layer and photoconductive layer are matched. The matching of these characteristics are as follows. When the photoconductive material preferentially conducts positive charge or holes to a greater extent than it conducts negative charge or electrons, then the electrode material is preferentially selected to have a high work function greater than about 4 eV and the insulating layer preferentially has a low ionization potential of below about 8 eV. On the other hand, when the photoconductive layer preferentially conducts electrons to a greater extent than it conducts holes, then the electrode preferentially has a low work function of below about 4 eV and the insulating layer preferentially has a high electron affinity greater than about 1.5 eV.

Exemplary photoconductive materials which preferentially conduct positive charges over negative charges include, for example, the photoconductive alloys such as, for example, arsenic triselenide and organic materials such as, for example, sensitized polyvinyl carbazole sensitized, for example, with selenium or selenium alloys or sensitizing dyes.

Exemplary examples of photoconductive materials which preferentially conduct negative charges over positive charges include sensitized zinc oxide in a binder and photoconductive sulfur containing compounds such as, for example, cadmium sulfide and cadmium sulfo-selenide. Ambipolar photoconductive materials, that is, those which conduct positive and negative charges with equal facility and exhibit no preferential conduction include, for example, selenium and selenium alloys doped with small amounts of arsenic, and polyvinyl carbazole containing a large amount of 2,4,7-trinitro-9-fluorenone. As indicated above, ambipolar materials may be satisfactorily employed in the practice of the present invention.

It has been found through experimentation that gain photocurrent is obtained in accordance with the practice of the present invention when the thickness ratio of photoconductive layer to insulating layer is at least about 10 to 1, or greater.

Figure 2:
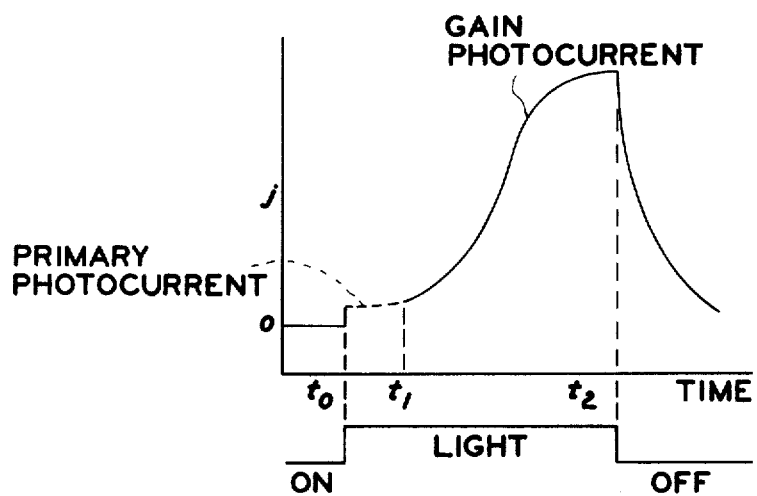
FIG. 2 is a graphical illustration of a representative plot of the behavior of photocurrent versus time in relation to excitation light which occurs during the practice of this invention.

FIG. 2 generally illustrates the typically observed photocurrent behavior in time in conjunction with the excitation light. At time equal $t_o$, the excitation light is turned on and one observes a steady state primary photocurrent. At time equal $t_1$, the photocurrent goes into the gain mode and then grows until it reaches a maximum gain current. At time equal $t_2$, the excitation light is turned off; the current decreases, eventually returning back to the dark current level. With repetitive experimentation, it was determined that for any particular device, the quantity or total charge conducted through the photoconductor before the onset of the gain photocurrent or secondary current is substantially constant and substantially independent of excitation light and applied voltage. Listed below in Table I is a tabulation of the results obtained on a device having an about 8µm thick arsenic triselenide photoconductive layer and an about 100A phenoxy insulating layer under an applied voltage across the device of about 120V. The wavelength of excitation light utilized was at about 498 nm. The only parameter varied was that of incident light flux.

As can be seen from Table I, the total charge or quantity of charge conducted through the photoconductor prior to onset of the secondary or gain photocurrent is substantially constant and is independent of the excitation light intensity.

TABLE I

| Incident Light FLux (photons/cm$^2$-sec) | Primary Current ($\mu$A/cm$^2$) | $t_1 - t_o$ (sec) | Pre-Gain Total Charge ($\mu$C/cm$^2$ |
|---|---|---|---|
| 9.26 × 10$^{11}$ | 0.12 | 4.90 | 0.59 |
| 1.77 × 10$^{12}$ | 0.21 | 2.84 | 0.60 |
| 2.80 × 10$^{12}$ | 0.32 | 1.82 | 0.58 |
| 5.33 × 10$^{12}$ | 0.52 | 1.10 | 0.57 |
| 8.45 × 10$^{12}$ | 0.91 | 0.67 | 0.61 |
| 1.61 × 10$^{13}$ | 1.46 | 0.42 | 0.61 |

It will be appreciated, of course, that the excitation light is one having a wavelength within the fundamental absorption band of the photoconductor and which excites a primary photocurrent in the photoconductor.

In addition to being independent of the excitation light intensity, the total charge going through the photoconductor prior to the onset of the secondary current was also determined to be independent of the applied voltage and insulating layer thickness. Additionally, this quantity of total charge was found to be only moderately dependent on the identity of the photoconductive material in photoconductor layer 3. The substantially constant nature of this total charge applied for any one given device and is found to vary somewhat from one particular device to another, even with identical materials for the insulating layer, electrode materials and photoconductive layer.

As can be seen from the FIG. 2 illustration, the secondary photocurrent gives a gain greater than unity. This portion of the photocurrent is typically referred to, and is herein denoted, gain photocurrent. Phenomenologically, it is theorized that as excitation light excites the photoconductor and thereby creates a pair of charge carriers, the positive charge moves towards the negative electrode and the negative charge moves towards the positive electrode. All charges of one polarity build up at the interface of the photoconductor and the electrode with which it is in contact and all charges of the other polarity move toward the insulating layer and build up at the interface between the insulating layer and the photoconductive layer with which it is in contact. At time $t_1$, the total charge at those interfaces is sufficient to create a critical electrical field across the insulating layer. At this point, charge injection into the valence band of the insulating material through thermally assisted tunneling becomes significant. The velocity of the tunneling charges in the insulating layer is very high, so the probability of recombination with charges of opposite polarity is small. As the excitation light keeps generating more charges at the interfaces, the electrical field across the insulating layer increases. This makes the insulating layer more transparent to tunneling charges, and the gain current increases until the generation and recombination of charges reach equilibrium. Experimental results are in general agreement with this theory and revealed that for any particular device the maximum gain photocurrent increases proportionally to the square of the voltage applied across the device.

It will be appreciated, of course, that since the obtaining of some gain photocurrent is dependent upon the total amount of primary current charge passing through any particular device and therefore independent of the applied voltage, notwithstanding the dependency of the maximum gain photocurrent upon applied voltage; the magnitude of the applied voltage may be conveniently preselected so that secondary current or gain photocurrent is exhibited relatively soon after turning on the excitation light or the applied voltage may be selected to provide a long time prior to exhibition of secondary current or gain photocurrent after turn-on of the excitation light. In this manner, one can conveniently tailor-make a device to provide any desired response speed of gain photocurrent creation subsequent to impingement of excitation light as one may desire. Typically, fast response speeds are preferable and, therefore, the higher voltages are preferably utilized. One should take into account however, that the maximum gain photocurrent for any particular device does vary directly with the square of the applied voltage. Therefore, the use of higher voltages gives not only a fast response time in the creation of the gain photocurrent but additionally provides a larger maximum gain photocurrent.

The tabulated data in Table II demonstrates that the gain photocurrent varies significantly with the work function of the electrodes. These data were taken on a device comprising an about 8μm thick layer of arsenic triselenide as the photoconductive layer and an about 100A thick phenoxy layer as the insulating layer. The applied voltage was at a strength of about $10^5$ V/cm, the excitation light incident on the device was at a wavelength of about 454 nm and at a flux of about $2 \times 10^{12}$ photons/cm$^2$-sec.

The data of Table II, below, demonstrate that the gained photocurrent varies significantly with the work function of the electrode material. Table II also further illustrates the general statement previously made that the characteristics of the photoconductor layer, insulating layer and electrodes should be matched in order to obtain even larger gain photocurrents.

TABLE II

| Electrode Material | Gained Photocurrent (A/cm$^2$) | Work Function (eV) |
|---|---|---|
| Aluminum | $2.7 \times 10^{-7}$ | 4.0 |
| Silver | $5.2 \times 10^{-7}$ | 4.3 |
| Copper | $6.0 \times 10^{-7}$ | 4.6 |
| Tin Oxide | $1.5 \times 10^{-6}$ | 4.8 |
| Gold | $1.6 \times 10^{-6}$ | 5.0 |

It will be noted that the photoconductive material utilized in the device from whcch the Table II data was obtained was arsenic triselenide, an alloyed photoconductor, which we indicated typically preferentially conducts positive charge or holes. Accordingly, we previously indicated that where the photoconductive material exhibited this characteristic, the electrode material should be selected to have a high work function. From Table II it can be seen that the higher the work function of the electrode material, the higher the gained photocurrent.

Referring again to FIG. 2, it can be seen that the practice of the present invention presents an electrical switch in which the gain photocurrent is provided subsequent to turn-on of the excitation light an is extinguished subsequent to the turn-off of the excitation light. Accordingly, the present invention lends itself very conveniently to the utilization of imaging layers, materials and systems which utilize either electrical fields, charge injection, or current flow in their imaging scheme.

Figure 3:
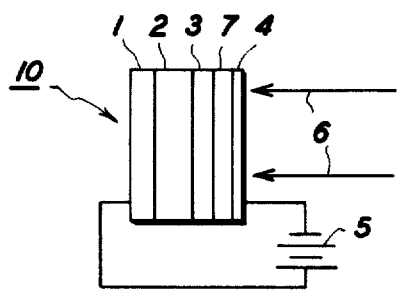
FIG. 3 is a schematic illustration of the gain photocurrent device used in conjunction with an imaging layer to enhance the imaging of said layer.

FIG. 3 schematically illustrates one embodiment wherein the present invention is applied to an imaging layer 7. It can be seen from FIG. 3 that the device structure is in all respects identical with that of FIG. 1 except that an imaging layer 7 is sandwiched between photoconductor layer 3 and electrode 4. In the embodiment schematically illustrated by FIG. 3, imaging layer 7 can conveniently be any suitable layer of material or combination of materials. For example, imaging layer 7 can be a liquid crystalline composition which exhibits dynamic scattering in the areas of current flow. In this case, the configuration of the current flow or gain photocurrent from the photoconductor and through the liquid crystalline material of imaging layer 7 will determine the areas of imaging layer 7 which exhibit dynamic scattering. Electrodes 1 and 4 can be shaped in image configuration in order to provide imagewise configured gained photocurrent; or, alternatively, the exciting light can be in imagewise configuration thereby causing the gain photocurrent to be exhibited in portions of imaging layer 7 corresponding to the portions of photoconductive layer 3 struck by the excitation light.

For a more detailed description of liquid crystalline material, methods, apparatus and utilizations wherein light can be diffusely scattered, or dynamically scattered to thereby provide imaging, see U.S. Pat. Nos. 3,592,527; 3,722,998 and 3,761,172, hereby expressly incorporated by reference. Speaking generally, such liquid crystalline materials comprise nematic mesophases and mixtures of nematic and cholesteric mesophases where in an applied voltage causes the selective diffusing and scattering of the selectively transmitted and reflected light.

Imaging layers and systems suitable for use in conjunction with the gain photocurrent device of the present invention include any imaging layer or system which can be imaged by application of a voltage which subjects the layer to either an electrical field, current or charge carrier flow, or the capture of charges such as, for example, that of U.S. Pat. No. 3,645,729, hereby incorporated by reference.

Imaging layer 7 may comprise any suitable display layer such as, for example, electrochromic displays. Such displays are readily known to those skilled in the art and will not be described in detail herein. Such displays include selective electroplating, pH changes in chemical compounds leading to a color change, reduction-oxidation reactions such as, for example, the formation of oxides of the transition metals, and a whole host of materials the optical properties of which change as a result of electric charge being trapped by said materials.

Typical suitable liquid crystalline field-effects include, for example, the optically negative to optically positive phase transformation disclosed in U.S. Pat. No. 3,652,148 hereby incorporated by reference; the twisted nematic to nematic transformation disclosed in U.S. Pat. No. 3,731,986, hereby incorporated by reference; the Grandjean to focal-conic texture transformation disclosed in U.S. Pat. No. 3,642,348, hereby incorporated by reference; and, the nematic field-effects such as, for example, the uniaxial to biaxial transformation disclosed in U.S. Pat. No. 3,687,515, hereby incorporated by reference. Generally speaking, liquid crystalline field-effects are obtained in accordance with the practice of the present invention provided (1) the photoconductor has a dark resistance sufficiently greater than that of the liquid crystalline material such that the electrical field which resides across the liquid crystalline material in the dark is below that required for imaging, and (2) in the presence of light, the resistance of the photoconductor is decreased to a value sufficiently low such that an electrical field is produced across the liquid crystalline material sufficient to produce the field-effect.

It will be readily appreciated by those skilled in the art that the gain photocurrent provided by the present invention decreases the amount of light otherwise required for the imaging of such displays and additionally provides more current during the interval $t_1$ and $t_2$ per applied voltage than would otherwise be the case in the absence of the gain photocurrent provided by the practice of the present invention.

Further, it is noted that the voltage source 5 in FIGS. 1 and 3 is schematically illustrated as a D.C. voltage source. The advantageous gain photocurrent according to the practice of the present invention is provided only by the utilization of a direct current voltage source. An alternating current voltage source does not provide the gain photocurrent of the present invention because the oscillation of charges does not result in the sufficient accumulation of charge and does not yield a sufficient electrical field across the insulating layer at $t_1$ (FIG. 2) for gain photocurrent. The voltage source 5 polarity is connected to the electrodes 1 and 4 in a manner that causes the more mobile charge carrier of the charge carrier pairs created by excitation light impinging the photoconductive layer to move away from the insulating layer. That is, in FIGS. 1 and 3, the polarity is connected such that the mobile charge carrier moves away from electrode 1 and towards electrode 4. Thus, when the photoconductor utilized preferentially conducts positive charge then the negative polarity of voltage source 5 is connected to electrode 4; conversely, when the photoconductor employed preferentially conducts negative charges then the positive polarity of the voltage source 5 is connected to electrode 4.

The following examples further specifically illustrate various preferred embodiments of the present invention. Parts and percentages are by weight unless otherwise indicated.

EXAMPLE I

A gain photocurrent device representative of that of FIG. 1 is prepared as follows:

A glass substrate overcoated with a thin, transparent indium oxide conductive layer is utilized as electrode 1. The electrode is prepared by cleaning with a solution of Alcanox in an ultrasonic bath for about 30 minutes. This cleaning is followed by an about 5 minute rinsing in running hot water and then in an about 5 minute rinsing in running deionized water. The electrodes are subsequently air-dried for 1 hour in an oven at about 60°C.

A phenoxy insulating layer is next applied over the indium oxide layer of one of the electrodes by dip coating. The thickness of the phenoxy layer is controlled by varying the concentration of a phenoxy resin solution comprising 2-methoxyethyl acetate and methyl ethyl ketone. A 1 to 1 volume ratio of the two solvents is utilized and the phenoxy resin is added in an amount which constitutes about 0.3 weight percent of the resulting solution. The electrode to be coated is dipped in the solution and withdrawn at a rate of about 5.6 centimeters per minute. The resulting thickness of the phenoxy insulating layer is determined by multiple beam interferrometry, transmission electron microscopy, and U.V. absorption measurements to be about 100A.

An arsenic triselenide photoconductive layer is then deposited over the phenoxy insulating layer by vacuum evaporation. The phenoxy coated electrode is first baked out in a vacuum of about $1 \times 10^{-5}$ Torr by radiation heating at about 85° to about 90°C for about 1 hour. The arsenic triselenide is evaporated from a "Knudsen cell" type tantalum boat. The thickness of the photoconductor layer is controlled by the amount of photoconductive material placed in the boat. A revolving wheel to which the phenoxy coated electrode is attached is utilized during evaporation to ensure uniform thickness of the resulting photoconductor layer. During evaporation of the arsenic triselenide, the temperature of the phenoxy coated electrode is maintained at about 45° to about 50°C in order that the resulting photoconductive layer of arsenic triselenide has good appearance and mechanical properties. The amount of arsenic triselenide placed in the boat is such that the resulting photoconductive layer has a thickness of about 8μm, determined by multiple beam interferrometric measurements. subsequently, a gold electrode is evaporated onto the free surface of the arsenic triselenide layer. The gold electrode in contact with the photoconductive layer is then connected to the negative terminal of a variable D.C. voltage source and the positive terminal thereof is connected to the electrode in contact with the phenoxy insulating layer.

EXAMPLE II

The procedure of Example 1 was followed to form gain photocurrent devices each of which comprised an insulating layer material different from that of other sample devices. In each of the sample devices, the electrodes are gold with the gold electrode adjacent the insulating layer being semi-transparent and about 50% transmissive to light whereas the gold electrode in contact with the photoconductive layer has a thickness of about 2000A. In all samples, the incident light is at a wavelength of about 454 nm and at a flux of about $4.58 \times 10^{-11}$ photons/cm$^2$-sec; the photoconductive layer is arsenic triselenide and is about 10 microns thick; the insulating layer thicknesses are between about 200 and about 300A.

TABLE III

| Insulating Layer Material | $\sqrt{E} \times 10^{-2}(V/cm)^{1/2}$ where E = field across the insulating layer | Gain Photocurrent (A/cm$^2$) |
|---|---|---|
| Phenoxy | 5.4 | $1 \times 10^{-8}$ |
| Phenoxy | 9.2 | $7.5 \times 10^{-8}$ |
| Phenoxy | 13.9 | $4 \times 10^{-7}$ |
| poly(2-propene-2-anthracene) | 6.2 | $3.1 \times 10^{-8}$ |
| poly(2-propene-2-anthracene) | 7.8 | $2.9 \times 10^{-7}$ |
| poly(2-propene-2-anthracene) | 8.8 | $1.3 \times 10^{-6}$ |
| poly(2-vinyl-anthracene) | 5.3 | $3.5 \times 10^{-8}$ |
| poly(2-vinyl-anthracene) | 7.9 | $3.5 \times 10^{-8}$ |
| poly(2-vinyl-anthracene) | 8.7 | $8 \times 10^{-7}$ |

The above data is representative of that obtained from a whole host of experiments on the three above-identified materials for the insulating layer. It is seen from the above representative data that the gain photocurrent does vary with the identity of the insulating material utilized in the insulating layer of the gain photocurrent device.

EXAMPLE III

The procedure of Example I is followed to produce a gain photocurrent device having the gold electrodes of Example II and a phenoxy insulating layer of a thickness of between 200 to about 300A. The gain photocurrent is measured as a function of the temperature at which the phenoxy material is maintained. The following data are representative of the data obtained.

TABLE IV

| $\sqrt{E} \times 10^{-2}(1/cm)^{1/2}$ | Temperature (°K) | Gain Photocurrent (A/cm²) |
|---|---|---|
| 2 | 277.7 | $8.5 \times 10^{-10}$ |
| " | 294.1 | $3.4 \times 10^{-8}$ |
| " | 313.2 | $1.8 \times 10^{-8}$ |
| 10 | 277.7 | $3.7 \times 10^{-8}$ |
| " | 294.1 | $9.3 \times 10^{-8}$ |
| " | 313.2 | $2.8 \times 10^{-7}$ |
| " | 330.2 | $1.4 \times 10^{-6}$ |
| 14 | 277.7 | $2.5 \times 10^{-7}$ |
| " | 294.1 | $4.7 \times 10^{-7}$ |
| " | 313.2 | $1.1 \times 10^{-6}$ |
| " | 330.2 | $4.3 \times 10^{-6}$ |

The above representative data show that the gain photocurrent is dependent upon temperature.

EXAMPLE IV

The procedure of Example I and the electrodes and photoconductive layer of Example III are utilized in fabricating gain photocurrent device samples. In each sample, however, the insulating material is varied. An applied electrical field of about $1.5 \times 10^5$ V/cm is applied to each sample and the excitation light is at a wavelength of 454 nm and at a flux of about $1.05 \times 10^{13}$ photons/cm²-sec.

TABLE V

| Insulating Layer Material | Insulating Layer Material (A) | Gain Photocurrent (A/cm²) |
|---|---|---|
| Polyvinyl carbazole | 250 | $10^{-5}$ |
| A 70/30 weight percent copolymer of styrene and hexylmethacrylate | 913 | $5.6 \times 10^{-6}$ |
| A 65/35 weight percent copolymer of styrene and n-butylmethacrylate | 653 | $9 \times 10^{-6}$ |
| LEXAN | 803 | $4.5 \times 10^{-6}$ |
| polystyrene | 845 | $4.5 \times 10^{-6}$ |

The above data demonstrate that the gain photocurrent does vary with the identity of the insulating material. A comprehensive review of all of the data obtained, however, demonstrates that the amount of gain photocurrent is not substantially affected by the thickness of the insulating layer for any given identity of insulating material utilized in the insulating layer.

EXAMPLE V

Experiments were conducted to determine whether the excitation light intensity had an effect on the gain photocurrent obtained. The procedure of Example I was followed to provide a gain photocurrent device having the gold electrodes of Example III and comprising a phenoxy insulating layer at a thickness of about 6500A, and a selenium photoconductive layer at a thickness of about 25 microns. The excitation light was at a wavelength of about 454 nm. The photon flux of the excitation light was varied and the primary and gain photocurrents observed were as follows: at a flux of $4 \times 10^{11}$ photons/cm²-sec the primary current is measured to be about $4 \times 10^{-8}$ amps/cm² while the gain photocurrent is measured to be about $2.5 \times 10^{-7}$ amps/cm²; at a flux of about $1.5 \times 10^{12}$ photons/cm²-sec the primary current was measured to be about $10^{-7}$ amps/cm² and the gain photocurrent was measured to be about $5 \times 10^{-7}$ amps/cm²; at a flux of about $4 \times 10^{12}$ photons/cm²-sec the primary current was measured to be about $3 \times 10^{-7}$ amps/cm² and the gain photocurrent was measured to be about $1.5 \times 10^{-6}$ amps/cm²; and, at a flux of about $1.2 \times 10^{13}$ photons/cm²-sec the primary current was determined to be about $8 \times 10^{-7}$ amps/cm² and the gain photocurrent was determined to be about $3.5 \times 10^{-6}$ amps/cm².

These data show a linear relationship between gain photocurrent and excitation light flux for a selenium photoconductive layer.

EXAMPLE VI

The procedure of Example I is utilized to provide a gain photocurrent device having the gold electrodes of Example III and comprising a phenoxy insulating layer at a thickness of about 100A and an arsenic triselenide photoconductive layer at a thickness of about 8 microns. The applied electrical field is at about $1.5 \times 10^5$ V/cm and the excitation light is at a wavelength of about 498 nm. The primary current and gain photocurrent were measured as a function of varying excitation light flux. The following data are representative of the data obtained: at a flux of about $10^{12}$ photons/cm²-sec, the primary current was measured to be about $1.3 \times 10^{-7}$ amps/cm² and the gain photocurrent was measured to be about $1.8 \times 10^{-6}$ amps/cm²; at a flux of about $8 \times 10^{12}$ photons/cm²-sec, the primary current was measured to be about $9 \times 10^{-7}$ amps/cm² and the gain photocurrent was observed to be about $6.5 \times 10^{-6}$ amps/cm²; and, at a flux of about $1.6 \times 10^{13}$ photons/cm²-sec the primary current was measured to be about $1.5 \times 10^{-6}$ amps/cm² and the gain photocurrent was measured to be about $1.8 \times 10^{-6}$ amps/cm².

A comprehensive review of the complete set of data indicates that for arsenic selenide the primary current varies linearly with the flux or intensity of the excitation light but that the gain photocurrent is proportional to the square root of the light intensity. It is further indicated, as one skilled in the art might expect, that the gain photocurrent varied with the identity of the photoconductive material. For example, it is noted that the arsenic triselenide photoconductive layer provides about four times as much gain photocurrent as the selenium photoconductive layer although its electrical field is only about one-half the strength of that utilized in the device containing the selenium photoconductive layer. This is not attributable to the difference in thicknesses between the phenoxy insulating layers utilized in the two gain photocurrent devices as will be seen in Example VII, below.

EXAMPLE VII

The procedure of Example I is utilized to provide gain photocurrent devices haivng the gold electrodes of Example III, phenoxy insulating layers of various thicknesses, and a photoconductive layer thickness of about 6 microns. Two sets of samples are made wherein the first set comprises arsenic triselenide and the second set comprises selenium, as the photoconductive layers. Each set of devices contains phenoxy insulating layers varying from about 10 to about 7000A in thickness. The first set of devices containing the arsenic triselenide photoconductive layer have an electrical field applied at a strength of about $1.5 \times 10^5$ V/cm whereas the second set of devices comprising the selenium photoconductive layers have an electrical field applied at a strength of about $4 \times 10^5$ V/cm. The excitation light utilized in operating both sets of devices is at a wavelength of about 454 nm and at a flux of about $1.05 \times 10^{13}$ photons/cm²-sec. Gain photocurrent is observed in the arsenic triselenide devices for phenoxy layers ranging from about 10 to about 3000A in thickness and the measured gain photocurrent is observed to be within the range from about $4 \times 10^{-6}$ amps/cm² to about $2 \times 10^{-5}$ and therefore varies little over a wide range of insulator thicknesses. It is especially noteworthy that gain photocurrent is observed in the arsenic triselenide devices with an insulation layer as thick as 2500A.

The set of devices containing selenium photoconductive layers exhibit photocurrent gain with insulating layers having thicknesses from about 60 to about 7000A.

The gain photocurrent is measured for these thicknesses to be within the range from about $2.8 \times 10^{-6}$ amps per centimeter square to about $7 \times 10^{-6}$ amps/cm². Again, the gain photocurrent varies little over a wide range of insulator thicknesses. Again, it is especially noteworthy that gain photocurrent was observed in devices comprising the selenium photoconductive layer and having insulating layer thicknesses as great as about 7000A.

EXAMPLE VIII

The procedure of Example I is followed to provide gain photocurrent devices for studying the effect of an applied electrical field on the resulting gain photocurrent. The devices comprise an indium oxide coated glass substrate as a semi-transparent anode overcoated with an about 400A thick phenoxy insulating layer which, in turn, is coated with an about 6.2 micron thick arsenic triselenide photoconductive layer. The cathode in contact with the photoconductive layer is an aluminum electrode. During operation of the devices, excitation light at a wavelength of about 454 nm and at a flux of about $1.05 \times 10^{13}$ photons/cm²-sec is utilized. The voltage, and therefore, the applied field, is set at variable settings and at each setting the resulting measured primary current and gain photocurrent are measured. The primary current tends to saturate at approximately $1.1 \times 10^{-6}$ amps/cm², corresponding to a quantum efficiency of about 0.73. The gain photocurrent shows no sign of saturation and increases proportionally to the square of the applied electrical field. Data representative of the complete set of data upon which the foregoing observations were made include the following: at an applied field of about $4 \times 10^4$ volts/cm, the measured primary current is $7 \times 10^{-7}$ amps/cm² and the gain photocurrent is measured to be about $1.3 \times 10^{-6}$ amps/cm²; at an applied electrical field strength of about $10^5$ V/cm, the primary current is measured at about $10^{-6}$ amps/cm² and the gain photocurrent is measured to be about $7.5 \times 10^{-6}$ amps/cm²; and, at an applied field strength of about $2 \times 10^5$ V/cm, the primary current is measured to be about $10^{-6}$ amps/cm² and the gain photocurrent is measured to be about $3 \times 10^{-5}$ amps/cm².

EXAMPLE IX

The embodiment in FIG. 3 is prepared by following the procedure of Example I to provide an imaging device comprising the indium oxide coated electrode of Example VIII overcoated with a phenoxy insulating layer at a thickness of about 100A, the phenoxy insulating layer being overcoated with an about 8.5 micron thick arsenic triselenide photoconductive layer. Another indium oxide coated conductive glass is placed face to face on the aforementioned photoconductive layer with an air-gap of about 13μm. The air gap is then filled with cholesteric liquid crystal and sealed with epoxy resin. A voltage of about 100 volts is applied to the device with the second electrode electrically connected to the negative terminal of the voltage source and the first indium oxide coated electrode connected to the positive terminal of the voltage source. The voltage source is a D.C. voltage. The cholesteric liquid crystalline composition utilized in the liquid crystalline layer comprises 80 weight percent p-methoxy-benzylidene-p-n-butylaniline (MBBA) and 20 weight percent cholesterol oleyl carbonate (COC). The device active area is about 4 cm².

An excitation light having a wavelength of about 545 nm and a flux of about $9.2 \times 10^{13}$ photons/cm²-sec incident on the phenoxy side of the device through the indium oxide coated electrode is utilized. After application of the voltage, exposures of about 14 msec pulse duration are given at intervals of about 20 seconds, and the current is measured at each exposure. The first exposure pulse produces a peak current of about 13.5 $\times 10^{-6}$ amps which returns to a dark current level of below about $0.1 \times 10^{-6}$ amps within about 100 msec. The second, third, and fourth pulse produce no significant change. However, at the fifth excitation pulse, the dark current after the light excitation begins to show some increase in magnitude and duration prior to returning to a level below about $0.1 \times 10^{-6}$ amps. The sixth excitation pulse produces a significant increase in magnitude and duration of the dark current. This phenomena indicated that each excitation pulse generated trapped electrons at the phenoxy/arsenic triselenide interface which are stable under the applied electric field. Apparently, as more pulsed exposures are given, trapped electrons accumulate at the phenoxy/arsenic triselenide interface; hence the electrical field across the phenoxy insulating layer keeps increasing. Eventually, the electrical field enhancement becomes high enough for the injection of positive charges or holes to become significant. The total negative charge accumulated at the phenoxy/arsenic triselenide interface after the fifth light pulse as calculated from the total charge flow per light pulse in these experiments is found to be about $0.65 \times 10^{-6}$ coulomb/cm². This value agrees very well with the average critical charge, or total charge of primary current prior to the onset of gain photocurrent or secondary current, noted in Table I above.

These observations and correlations made in this Example IX indicate that the excitation light need not necessarily be continuously impinging on the photoconductive layer prior to onset of secondary current or gain photo current, but that pulsed light can be utilized to initiate the onset of gain photocurrent. Mechanistically, the observations and correlations indicate that trapping of charges occurs at the interface between the insulating layer and photoconductive layer.

EXAMPLE X

The imaging device with the imaging layer of Example IX is subjected to a steady relatively low intensity illumination at a wavelength of about 545 nm and at a flux below $10^{12}$ photons/cm²-sec., during the application of about 220 D.C. volts. The intensity of the excitation light is insufficient to produce a gain photocurrent within a few seconds and the primary photocurrent produced is insufficient to cause texture transformation of the cholesteric liquid crystalline layer from the Grandjean texture to the focal-conic texture. The voltage and excitation light are turned off. While the voltage is reapplied, the device is exposed to a strobe light pulse at an incident intensity at about $8 \times 10^{12}$ photons/cm² pulse at about 545 nm. The intensity of the strobe light pulse is insufficient to produce a gain photocurrent and the primary current produced is insufficient to cause texture transformation of the cholesteric liquid crystalline layer. The voltage is turned off.

The voltage is re-applied and the device is then illuminated with the steady low intensity illumination and the strobe light is pulsed once, the combined illumination providing total incident photons of at least about $9 \times 10^{12}$ photons/cm². The two exposures together substantially immediately (i.e., within a fraction of a second) generate a gain photocurrent, and the resultant current is sufficiently high to cause a texture transformation in the cholesteric liquid crystalline layer from the Grandjean texture to the focal-conic texture.

EXAMPLE XI

The device and simultaneous exposure of Example X is followed; however, the strobe light pulse is passed through an imagewise configured mask which permits only imagewise configured strobe light to impinge the device. The cholesteric liquid crystalline layer is transformed in texture from the Grandjean to the focal-conic texture in imagewise configuration corresponding to the imagewise configured strobe light impinging the device.

EXAMPLE XII

Example XI is followed except that the steady low intensity illumination is provided in imagewise configuration while the strobe light pulse uniformly impinges the device.

In conclusion, two noteworthy parameters and their relationship to variables within the device and method for producing gain photocurrent will now be discussed. The two parameters are (1) the total primary current charge accumulated prior to the onset of gain photocurrent, and (2) gain photocurrent.

The total primary current charge accumulated prior to the onset of gain photocurrent has been observed to be substantially constant and not significantly affected by variations in thicknesses of the layers, the value of the applied voltages, the value of the light intensities, and the identity of the photoconductive materials. On the other hand, the total primary current charge accumulated prior to the onset of gain photocurrent has been observed to be variable with, or affected by, the work function of the anode electrode, the identity of the insulating layer material, and temperature. It should be additionally mentioned that for temperatures in the range of about 0° to about 20°C (20° to 40°C below room temperature) the amount of total primary current charges accumulated prior to onset of gain photocurrent becomes larger. Also, at temperatures from about 40° to about 60°C (about 20° to about 40°C above room temperature) the amount of total primary current charge accumulated prior to the onset of gain photocurrent becomes smaller than the value at room temperature.

With respect to the gain photocurrent, it has been observed that the gain photocurrent is significantly affected by the work function of the electrodes, particularly that of the anode; the identity of the insulating material but not the thickness of the insulating layer; the applied electrical field; the identity of the photoconductive material; the intensity of excitation light; and, temperature.

It will be understood, of course, that the above described relationships are illustrative and characterize the phenomenon provided by the practice of the present invention. It is to be understood that these characteristics are not limiting and that the gain photocurrent provided by the practice of this invention is obtained by utilizing any suitable insulating layer in contact with a photoconductive layer, both layers being sandwiched between two electrodes, where the thickness ratio of photoconductor to insulator is at least about 10 to 1. In operation, the gain photocurrent of the present invention is provided by applying a voltage across the device and while the voltage is applied, impinging said device with light having a wavelength within the fundamental absorption band of the photoconductive material and which excites a primary photocurrent in the photoconductive layer. As long as a primary current is created in the photoconductive layer by impingement of the excitation light, the intensity of the excitation light and the magnitude of the applied voltage can be any preselected value desired. Eventually, with time, the total primary current charge accumulated will become sufficiently great to initiate the onset of gain photocurrent.

It will be appreciated that other variations and modifications will occur to those skilled in the art upon a reading of the present disclosure. These are intended to be within the scope of this invention.

What is claimed is:

1. A gain photocurrent device comprising, in turn, a first electrode comprising material having a work function greater than about 4 eV; an organic insulating layer having an ionization potential below about 8 eV, in contact with said first electrode; a photoconductive layer which preferentially conducts positive charge over negative charge, in contact with said insulating layer; and, a second electrode in contact with said photoconductive layer; the thickness ratio of said photoconductive layer to said organic insulating layer being at least about 10 to 1.

2. A gain photocurrent device comprising, in turn, a first electrode comprising material having a work function below about 4 eV; an organic insulating layer having an electron affinity greater than about 1.5 eV, in contact with said first electrode; a photoconductive layer which preferentially conducts negative charge over positive charge; and, a second electrode in contact with said photoconductive layer; the thickness ratio of said photoconductive layer to said organic insulating layer being at least about 10 to 1.

3. The device of claim 1 wherein said photoconductive material comprises arsenic triselenide.

4. The device of claim 3 wherein said organic insulating layer comprises an insulating material selected from the group consisting of phenoxy resin, poly(2-propene-anthracene), poly(2-vinyl-anthracene) and poly[1-(2-anthryl) ethylmethylacrylate].

5. The device of claim 2 wherein said material in said first electrode is selected from the group consisting of silver, tin, aluminum, and indium.

6. The device of claim 1 wherein said material in said first electrode is selected from the group consisting of platinum, copper, gold, tin oxide, and indium oxide.

7. The gain photocurrent device of claim 1 further including an imaging layer sandwiched between said photoconductive layer and one of said electrodes, said imaging layer comprising material having at least one optical property which undergoes change when said material is subjected to an applied voltage.

8. The device of claim 7 wherein said imaging layer comprises a material selected from the group consisting of nematic liquid crystalline materials, cholesteric liquid crystalline materials and mixtures thereof.

9. The device of claim 7 wherein said imaging layer comprises about 80% by weight p-methoxy-benzylidene-p-n-butyl-aniline and about 20% by weight cholesterol oleyl carbonate.

10. The device of claim 7 wherein said imaging layer is electrochromic.

11. The method of providing gain photocurrent, comprising:
  a. providing the gain photocurrent device of claim 1;
  b. applying a D.C. voltage across said device; and
  c. impinging said photoconductive layer with light having a wavelength within the fundamental absorption band of photosensitive material within said photoconductive layer and which excites a primary current within said photoconductive layer, for a period of time wherein gain photocurrent is obtained.

12. A method of imaging, comprising:
  a. providing the gain photocurrent device of claim 7;
  b. applying a D.C. voltage across said device; and
  c. impinging said device with light in imagewise configuration, said imagewise configured light having a wavelength within the fundamental absorption band of photoconductive material within said photoconductive layer and which excites a primary current within said photoconductive layer, for a period of time wherein gain photocurrent is obtained.

13. The method of claim 12 wherein in step (c) said light impinging said device comprises light from at least two sources, one of which is in imagewise configuration, the coincidence of the light from one source with that from the other source being sufficient to substantially immediately initiate gain photocurrent in said device, and the light from each source alone being insufficient to substantially immediately initiate gain photocurrent in said device.

* * * * *